(12) United States Patent
Rai et al.

(10) Patent No.: US 7,581,154 B2
(45) Date of Patent: Aug. 25, 2009

(54) METHOD AND APPARATUS TO LOWER OPERATING VOLTAGES FOR MEMORY ARRAYS USING ERROR CORRECTING CODES

(75) Inventors: Nivruti Rai, Portland, OR (US); Anshumali Kumar, Hillsboro, OR (US); Edward Burton, Hillsboro, OR (US); Sunit Tyagi, Portland, OR (US); Jeffrey L. Miller, Vancouver, WA (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 11/174,003

(22) Filed: Jun. 30, 2005

(65) Prior Publication Data

US 2007/0022360 A1 Jan. 25, 2007

(51) Int. Cl.
*G11C 29/00* (2006.01)
(52) U.S. Cl. .................. 714/773; 714/758; 714/764
(58) Field of Classification Search .............. 714/773, 714/758, 14, 703, 723, 764, 203
See application file for complete search history.

(56) References Cited

U.S. PATENT DOCUMENTS

| 3,638,183 | A | * | 1/1972 | Progler et al. ............... 714/709 |
| 4,495,596 | A | * | 1/1985 | Sciulli ........................ 714/14 |
| 4,617,664 | A | * | 10/1986 | Aichelmann et al. ........ 714/758 |
| 4,924,465 | A | * | 5/1990 | Matsubara et al. .......... 714/703 |
| 5,103,465 | A | * | 4/1992 | Crisler et al. ............... 375/359 |
| 5,604,753 | A | | 2/1997 | Bauer et al. |
| 6,490,703 | B1 | | 12/2002 | de la Iglesia et al. |
| 6,552,887 | B1 | | 4/2003 | Karnik et al. |
| 6,598,199 | B2 | | 7/2003 | Tetrick |
| 6,704,880 | B2 | | 3/2004 | Dai et al. |
| 6,732,288 | B2 | | 5/2004 | de la Iglesia et al. |
| 6,993,692 | B2 | * | 1/2006 | Ouellette et al. ............. 714/723 |
| 7,178,088 | B2 | * | 2/2007 | Hashimoto et al. .......... 714/764 |
| 7,328,377 | B1 | * | 2/2008 | Lewis et al. ................ 714/48 |
| 7,339,834 | B2 | * | 3/2008 | Lutze ..................... 365/185.28 |

* cited by examiner

*Primary Examiner*—Esaw T Abraham
*Assistant Examiner*—Fritz Alphonse
(74) *Attorney, Agent, or Firm*—Blakely, Sokoloff, Taylor & Zafman LLP

(57) ABSTRACT

A method comprising running an error correction code on data and storing the data and the result of the error correction code in memory, running an error correction code on the data when it is read from the memory, comparing the results of the error correction codes on the data from before and after the memory, correcting errors when the comparator determines a difference in the results of the error correction codes and lowering the operating voltage of the memory array while using the error correction.

19 Claims, 6 Drawing Sheets

| Option | Area Penalty | Operating Voltage Benefit | Yield Impact |
|---|---|---|---|
| Larger Cell | ~20% | 5-10% | 2% |
| Redundant Blocks | 2% -5% | Drop blocks with poor Vccmin | 2% - 5% |
| ECC | ~ 10% | 10% -20% | 0% |

FIG. 2

METHOD AND APPARATUS TO LOWER OPERATING VOLTAGES FOR MEMORY ARRAYS USING ERROR CORRECTING CODES

BACKGROUND

Integrated circuit technologies continue to evolve at a frantic pace. Computing and communications designs are incorporating more functionality, higher processing and transmission speeds, smaller feature sizes, more memory, etc., into smaller and more robust architectures.

SRAM memories may be used for high speed data storage inside modern microprocessors. Two significant results of continuing integrated circuit technology scaling are smaller transistor size, and more transistors per chip. Each of these features limits the lowest operating voltage (Vccmin) for SRAM memories.

As transistors become smaller, their relative variability increases, making matching of transistors more difficult. A number of physical reasons cause the variability to increase for smaller transistor size. For example, as the transistors become smaller, random dopant fluctuation and patterning control both become relatively larger.

Matching of transistors is critical for data stability in a 6-T SRAM bit cell, as any asymmetry leads to easier loss of data. Thus the likelihood of device mismatch for smaller cell size increases the Vccmin of the SRAM.

As SRAM bit density increases for a given chip area, the memory array size on the chip increases. Larger memory sizes involve more memory bits, therefore the mismatch problem between transistors is multiplied. As the array size increases, the chance for getting a bit with a large mismatch on a die increases. Since the Vccmin of the array is the highest value for any of the bits in the array, the array Vccmin increases with array size.

Together the two reasons stated above lead to an increase in the Vccmin with each technology generation. The first trend is unavoidable as smaller cell size is the main advantage of technology scaling. We describe here a method and apparatus to address the issue of increasing Vccmin with larger array size.

BRIEF DESCRIPTION OF THE DRAWINGS

Embodiments of the invention may be best understood by reading the disclosure with reference to the drawings, wherein:

FIG. 2 is a table illustrating different methods to lower voltages in a memory.

DETAILED DESCRIPTION

In the following description, numerous specific details are set forth. However, it is understood that embodiments of the inventions may be practiced without these specific details. In other instances, well-known circuits, structures, and techniques have not been shown in detail in order to not obscure the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment.

Some embodiments may run an error correction code on data before and after it is stored in a memory and then compare the results of the error correction codes and correct data where need be. This approach allows the memory to operate at a lower voltage while maintaining the same robustness. This is particularly applicable to lowering minimum operating voltage of SRAMs, but is not so limited.

Any error correction scheme may be used, examples include a double error correct triple error detect (DECTED) method and a single error correct double error detect (SECDED) method.

An SRAM embodiment may consist of organizing the memory array to reduce the Vccmin by using error correcting codes (ECC) to catch and correct bit errors in memory blocks. This is possible since the percent fail rate decreases significantly as the block size is reduced, then for these smaller block sizes errors can be corrected using an ECC scheme.

Using the combination of ECC and memory organization, the overall fail rate at a given voltage is reduced and in turn a memory array can operate at lower operating voltages.

A traditional approach to address Vccmin issues is to modify a memory cell to provide intrinsic margin. This results in larger cell size and thus impacts the area density of bits. ECC codes can be used to control Vccmin without having to scale cells. Although there are additional bits needed to store ECC information, overall efficiency of density of useable bits is still improved over prior methods.

Figure 1:
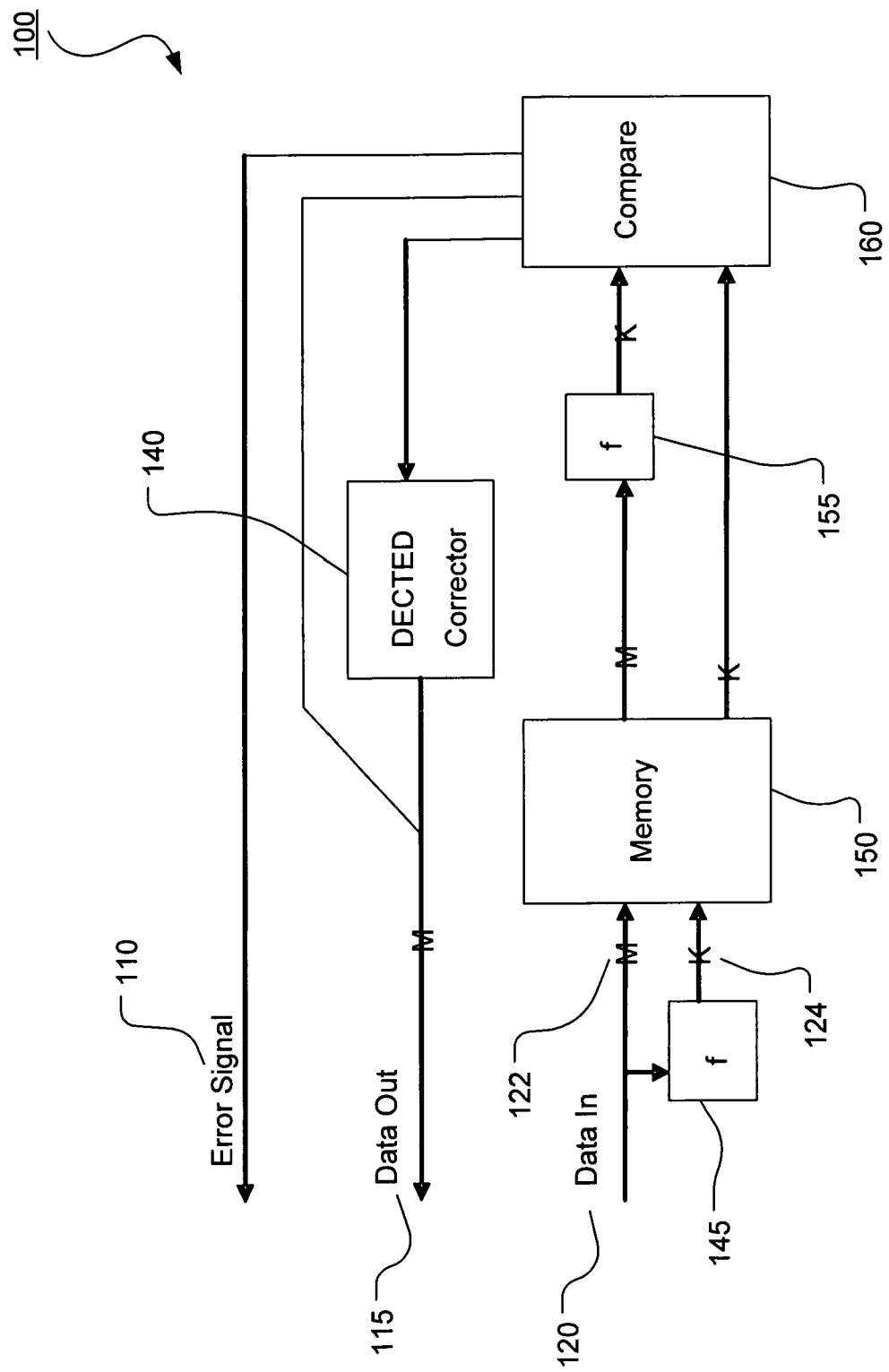
FIG. 1 illustrates an embodiment of the present invention that can use error correction to lower an operating voltage of a semiconductor.

FIG. 1 illustrates an embodiment of the present invention 100 that can use error correction to lower an operating voltage of a semiconductor. This embodiment may be used to lower a minimum operating voltage, Vccmin, in an SRAM, but need not be so limited. For example, embodiments may beneficially be used for a register file to lower an operating voltages with the use of ECC codes.

Referring to the embodiment 100 in FIG. 1, data 122 is input to memory 150 over a data input 120. The input data 122 is also run through some function 145 on the data and store the result 124 in memory. An example function 145 is an ECC, and more particularly an ECC such as DECTED or SECDED.

The original input data 122 and the resulting data 124 from function block 145 is then read from memory 150. The original input data 122 read from memory 150 is then manipulated by the same function as in function block 145, ideally providing the same value as the resulting data 124 read from memory 150.

After the original input data 122 is run through the same function in functional block 155, the two sets of data are compared in block 160. If an error is detected, it can be corrected in corrector 140 and be output data 115. If no error was detected in the comparison in block 160, corrector 140 may be by passed and the original data 122 is output data 115.

In the embodiment in FIG. 1, an error signal 110 may also be sent when the comparator 160 detects a difference in its input values. The embodiment in FIG. 1 provides one way to use error correction on data before and after it is stored, but embodiments are not so limited. The error correction allows memory arrays, register files, etc., to operate at lower voltages.

An embodiment may include a memory apparatus comprising a memory array with at least one input to receive data, first circuitry coupled with the input and the memory array to run an error correcting code (ECC) on the data to be input to the memory array, second circuitry coupled with an output of the memory array, the second circuitry to receive data from the memory array and run the error correcting code on the data, a comparator to compare the results from the first circuitry and the second circuitry, and an error corrector to correct the data when errors are detected and allow a reduced operating voltage of the memory array.

The present embodiment may further comprise an output of the comparator to provide an error signal when the comparator detects a difference in the results from the first circuitry and the second circuitry.

In one embodiment the memory array is an SRAM memory array. Another exemplary embodiment may be used in a register file. Embodiments may use any ECC scheme, including DECTED and SECDED ECC schemes.

FIG. 2 is a table illustrating different methods to lower voltages in a memory. In particular, FIG. 2 illustrates the effect of reducing memory block size on the defects per million (DPM) as a function of voltage.

Referring to FIG. 2, the leftmost column illustrates various methods to lower operating voltages such as Vccmin. The three methods represented in the table in FIG. 2 include making larger memory cells to reduce the relative variations between bits, using redundant blocks to reduce voltage, or using ECC to reduce an operating voltage.

In the second row under the option column, the use of larger cells is considered. The second column shows that the area penalty for a typical larger cell approach is on the order of 20 percent, however, in the next column the operating voltage benefit is on the order of 5-10 percent, in this case for Vccmin. The yield impact for this approach is approximately 2 percent.

In the third row, use of redundant blocks is contemplated. Redundant blocks have an area penalty ranging from approximately 2 percent to 5 percent. This approach drops blocks with poor operating voltages, such as Vccmin, in order to provide a reduced operating voltage. The yield impact for the redundant blocks method to reduce operating voltage is similar to the area penalty of this method, ranging from approximately 2 percent to 5 percent.

The last row in FIG. 2 illustrates using ECC to reduce an operating voltage. Although the ECC method to reduce an operating voltage has an area penalty around 20 percent, the operating voltage is reduced considerably relative to the other methods. For example, the Vccmin benefit can range from 10 percent to 20 percent. This method therefore has negligible yield impact, on the order of 0 percent, and is therefore a favorable method.

Figure 3:
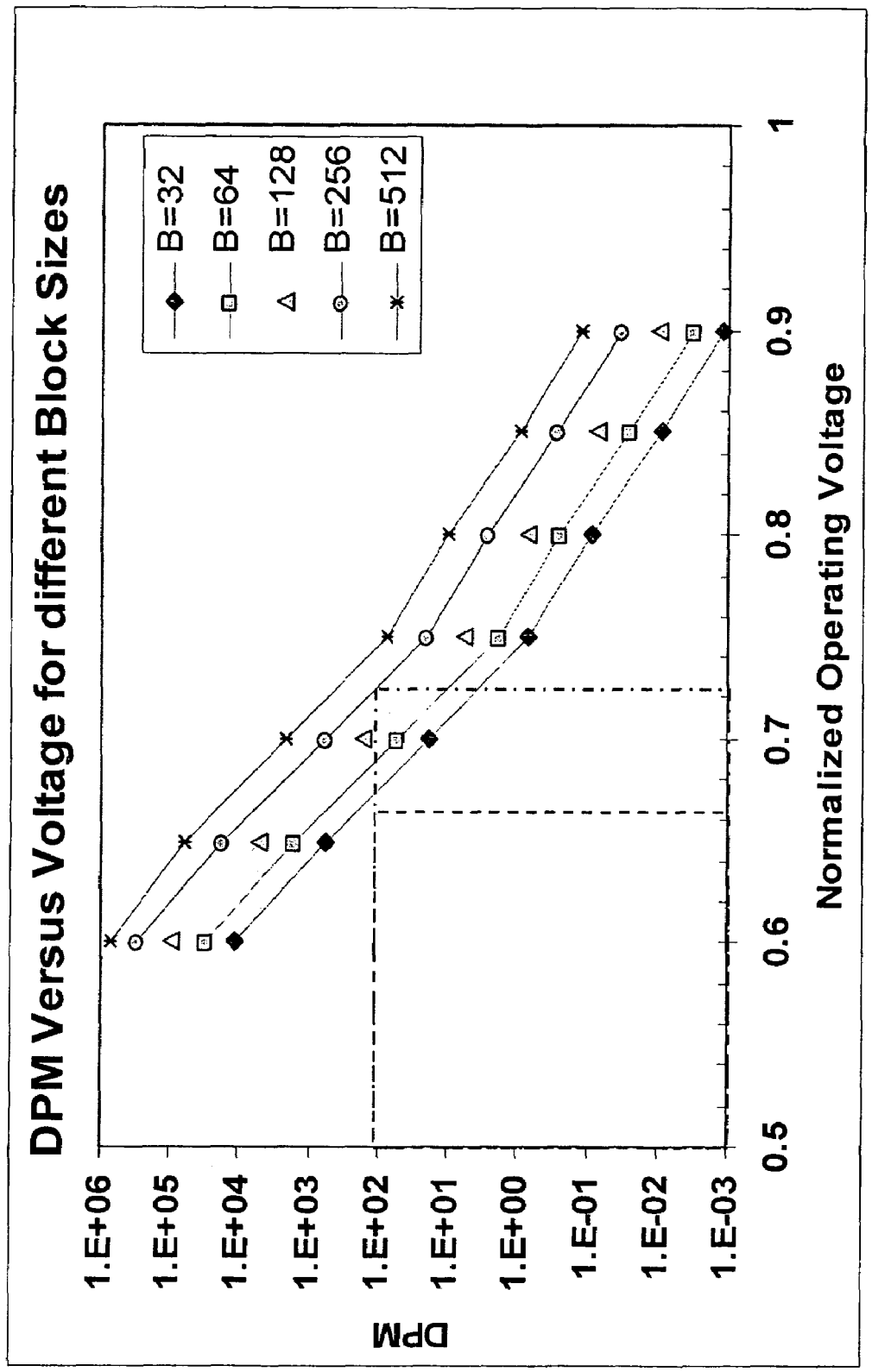
FIG. 3 is a graph illustrating defects per million (DPM) in relation to voltage for different block sizes of memory.

FIG. 3 is a graph illustrating defects per million (DPM) in relation to voltage for different block sizes of memory. The graph illustrates block sizes from 32 bits, 64 bits, 128 bits, 256 bits and 512 bits. As would be expected, the larger block sizes have a higher number of defects due to higher probabilities over higher numbers of bits. As can be seen in this graph, in general, increases in voltage result in the defects being minimized.

The DPM increases for lower voltages, the Vccmin of the block is effectively higher for a defined acceptable level of DPM. As shown in FIG. 3, going from 256 bits block size to 32 bits reduces the Vccmin by an appreciable margin.

Figure 4:
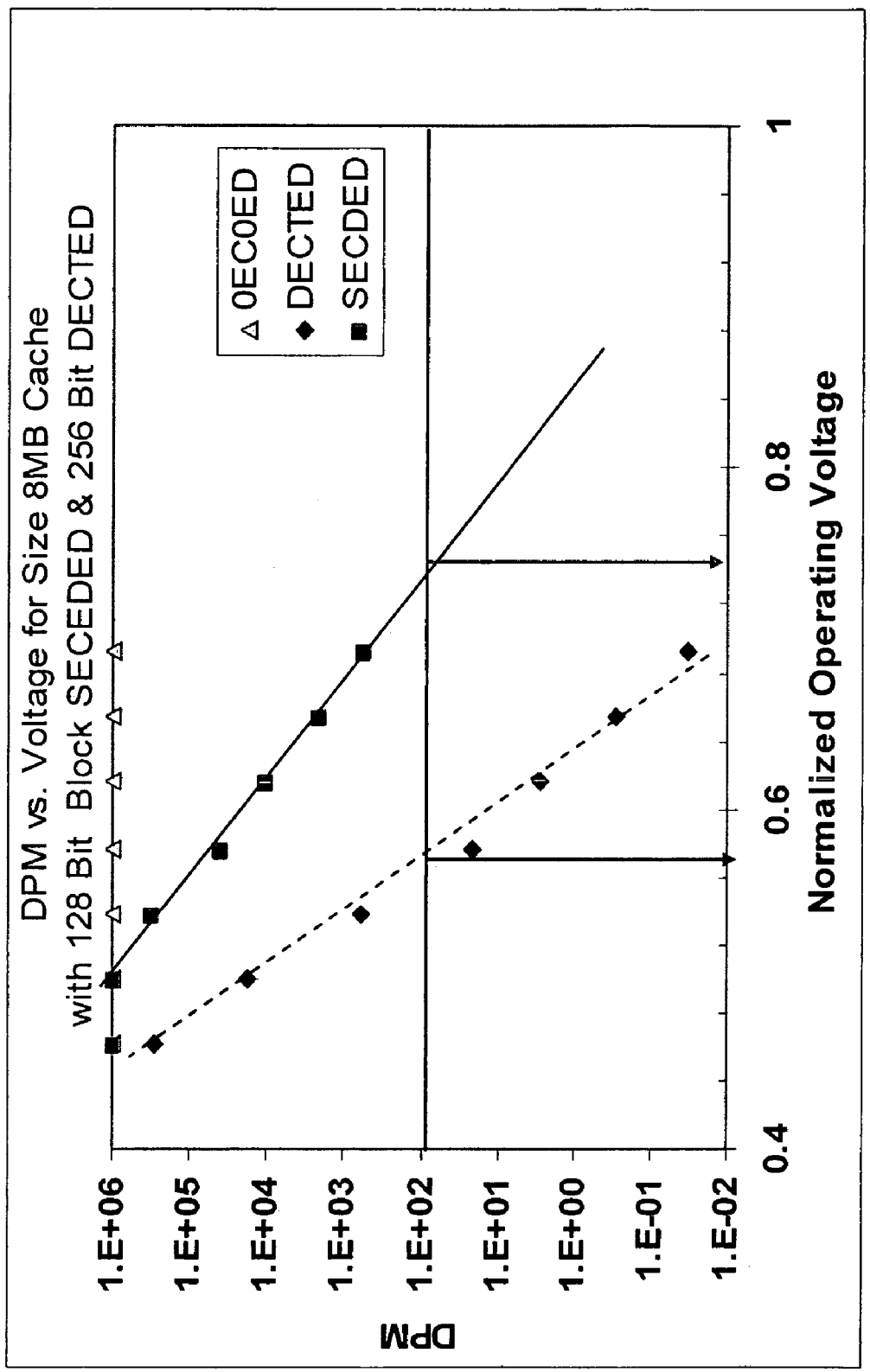
FIG. 4 is a graph illustrating DPM in relation to voltage for 128 bit block size with different levels of error correction.

FIG. 4 is a graph illustrating DPM in relation to voltage for 128 bit block size with different levels of error correction. An embodiment may use ECC to improve Vccmin, as shown in the figure.

For example, the use of single error correct double error detect (SECDED) ECC scheme give 20 percent normalized voltage benefit, the use of a more sophisticated Double Error Correct Triple Error Detect (DECTED) ECC scheme would give additional 20 percent normalized voltage reduction.

Referring to the graph in FIG. 4, an improvement of nearly 20 percent normalized voltage is possible in an 8 MB cache which is partitioned into blocks with 128 bits each.

Figure 5:
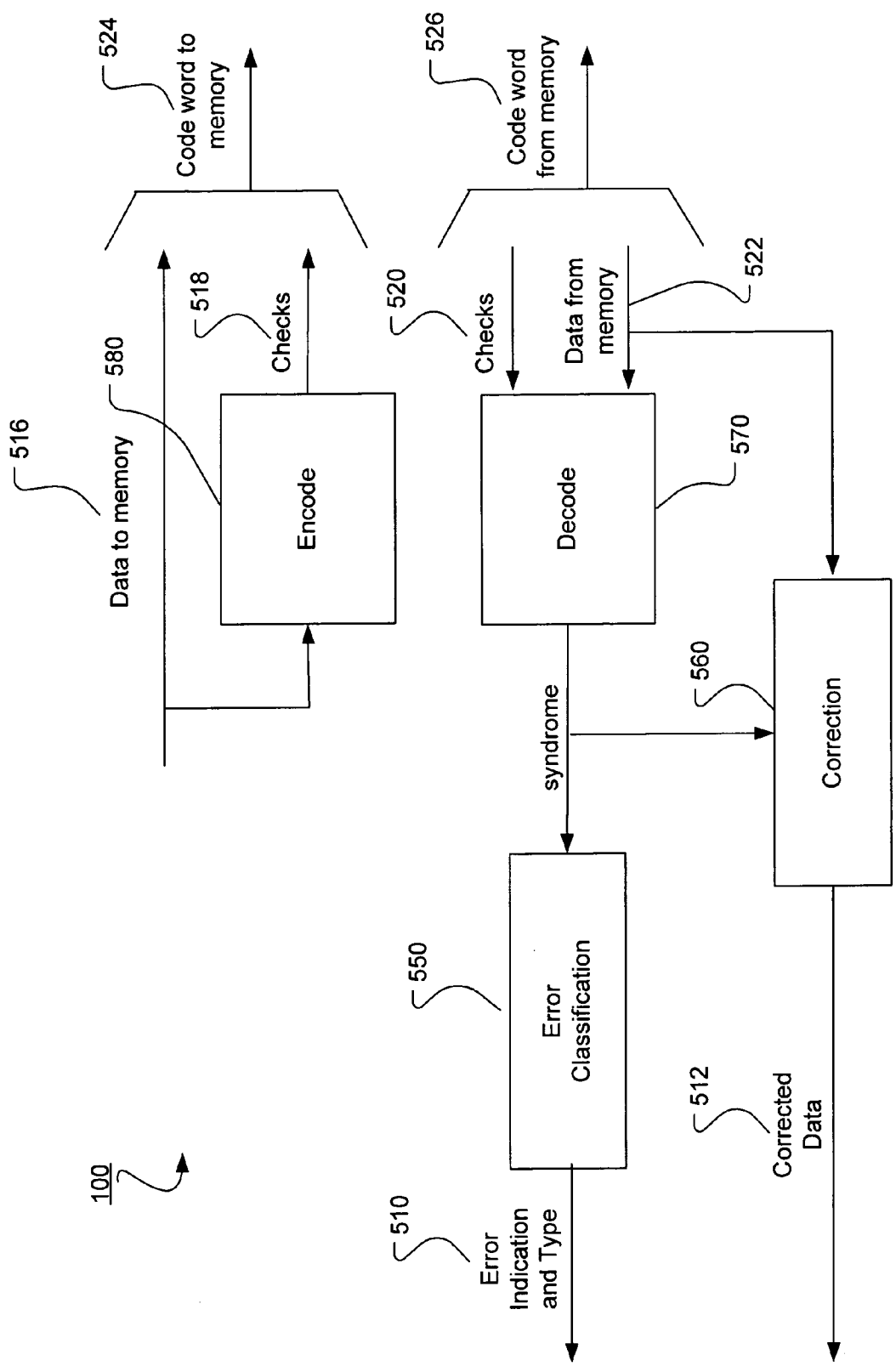
FIG. 5 illustrates a double error correct triple error detect embodiment to lower an operating voltage of a semiconductor.

FIG. 5 illustrates a DECTED circuit 500 that may lower an operating voltage of a semiconductor. In the present embodiment, DECTED circuit 500 includes an encode block 580, a decode block 570, a correction block 560 and an error classification block 550.

In encode block 580, data 516 is input to memory and to an encoder circuit and used to compute check bits 518. In an embodiment check bits 518 may be XOR parity generations of groupings of the data. These check bits 518 then may be appended to the input data 516 to form a code word 524 which is then sent to memory with the initial data to memory 516.

In decode block 570, data 522 and check bits 520 are received from memory and input into the decode block. In the present example, the a decoder circuit is used to compute a syndrome 514 from the code word 526. An example circuit that may perform this computation can be derived from an H-matrix.

Similar to encode block 580, this may be performed by XOR operations over the code word 526 bits, for example by code word bits corresponding to columns of an H-matrix that have a "1". In the present embodiment, the a decoder circuit can consist of multiple XOR trees, with each tree computing a syndrome bit 514. In an embodiment, the number of inputs to each XOR tree may vary from row to row for an H-matrix.

In error classification block 550, the syndrome 514 computed in decode block 570 can be used to classify errors that occur in the input code word 526. In an DECTED embodiment, the error classification block 550 can use the syndrome 514 to compute different classifications 510 including: 1) no errors; 2) single bit errors, which are correctable in a DECTED scheme; 3) double bit errors, which are likewise correctable in a DECTED scheme; and 4) triple bit errors, which in the current embodiment are detectable but not correctable. In some embodiments, errors greater than 3 bits per code word may also be detectable depending upon the robustness of the ECC scheme used.

In the correction block 560 of FIG. 5, an error correct circuit may perform logical computations of the syndrome bits 514 to identify and correct one or more corrupted data bits in the data portion of a code word 526, and then output corrected data 512.

Figure 6:
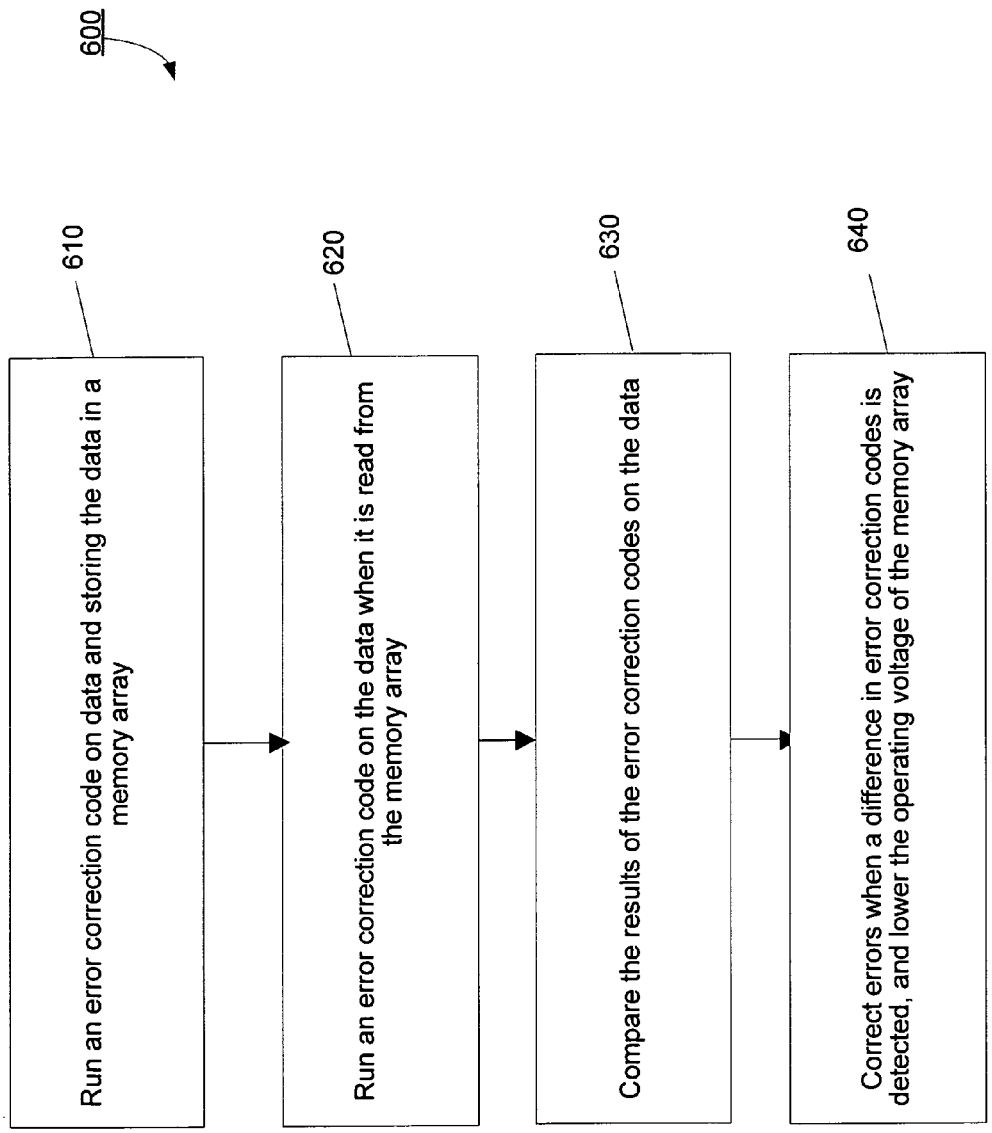
FIG. 6 illustrates an embodiment method that uses error correction to lower an operating voltage of a semiconductor.

FIG. 6 illustrates an embodiment method 600 that uses error correction to lower an operating voltage of a semiconductor. In block 610, an error correction code is run on data and the data is stored in a memory array. In block 620, an error correction code is run on the data when it is read from the memory array. At block 630, the results of the error correction codes are compared.

Block 640 comprises correcting errors when a difference in the results of the error correction codes is detected, and lowering the operating voltage of the memory array. Example memory arrays may be SRAMs or even a register file, but embodiments are not so limited.

In an exemplary embodiment the lowered operating voltage may be Vccmin. Alternate embodiments may apply error correcting schemes to lower operating voltages for silicon memory to reduce power requirements. In another embodiment, error detection may be used an then operating voltage may be adjusted to reach a threshold error level.

An embodiment may be a system comprising a battery power source, and a memory coupled with the battery power source, the memory comprising, a memory array with at least one input to receive data, a first circuitry coupled with the input and the memory array to run an error correcting code on the data before being input to the memory array, a second circuitry coupled with an output of the memory array, the second circuitry to receive data from the memory array and run the error correcting code on the data, a comparator to compare the results from the first circuitry and the second circuitry, and an error corrector to correct the data when errors are detected and allow a reduced operating voltage of the memory array.

In the present embodiment, the memory array may be an SRAM memory array. In another embodiment, the memory array may be a register file. Yet another example of the present embodiment may comprise an output of the comparator to provide an error signal when the comparator detects a difference in the results from the first circuitry and the second circuitry.

Similar to the embodiment memories listed above, an embodiment system may use a DECTED or a SECDED error correction scheme, but need not be so limited.

In the present embodiment, the memory array has a reduced operating voltage due to the error correction.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. A memory apparatus comprising:
a memory array with at least one input to receive data;
first circuitry coupled with the input and the memory array to run an error correcting code (ECC) on the data to be input to the memory array;
second circuitry coupled with an output of the memory array, the second circuitry to receive data from the memory array and run the error correcting code on the data;
a comparator to compare the results from the first circuitry and the second circuitry; and
an error corrector, coupled with the memory array, to correct the data when errors are detected based on the results of the comparator, wherein an operating voltage of the memory apparatus is adjusted, by increasing or decreasing the operating voltage of the memory apparatus, to reach a threshold error level based on results of the error detection.

2. The memory apparatus of claim 1, wherein the memory array is an SRAM memory array.

3. The memory apparatus of claim 1, comprising an output of the comparator to provide an error signal when the comparator detects a difference in the results from the first circuitry and the second circuitry.

4. The memory apparatus of claim 1, wherein the error corrector corrects the data by a double error correct triple error detect scheme.

5. The memory apparatus of claim 1, wherein the error corrector corrects the data by a single error correct double error detect scheme.

6. The memory apparatus of claim 1, wherein the memory array is a register file.

7. A method comprising:
executing a first error correction code on data before the data is stored in a memory array;
storing the data and the first error correction code in the memory array;
executing a second error correction code on the data when the data is read from the memory array;
comparing the results, by a comparator, of the first and the second error correction codes on the data;
correcting errors, by an error corrector, when a difference in the results of the first and the second error correction codes is detected; and
adjusting an operating voltage of the memory array, by increasing or decreasing the operating voltage, to reach a threshold error level based on the results of the error detection.

8. The method of claim 7, wherein the errors are corrected with a double error correct triple error detect scheme.

9. The method of claim 7, wherein the errors are corrected with a single error correct double error detect scheme.

10. The method of claim 7, wherein the operating voltage is adjusted to a minimum operating voltage (VccMin) of the memory array.

11. The method of claim 7, wherein the memory array is an SRAM.

12. The method of claim 7, wherein the memory array is a register file.

13. A system comprising:
a battery power source; and
a memory coupled with the battery power source, the memory comprising:
a memory array with at least an input to receive data;
a first circuitry coupled with the input and the memory array to run an error correcting code on the data before the data is input to the memory array;
a second circuitry coupled with an output of the memory array, the second circuitry to receive data from the memory array and run the error correcting code on the received data;
a comparator to compare the results from the first circuitry and the second circuitry; and
an error corrector, coupled with the comparator, to correct the data when errors are detected based on the results of the comparator, wherein an operating voltage of the memory is adjusted, by increasing or decreasing the operating voltage, to reach a threshold error level based on results of the error detection.

14. The system of claim 13, wherein the memory array is an SRAM memory array.

15. The system of claim 13, comprising an output of the comparator to provide an error signal when the comparator detects a difference in the results from the first circuitry and the second circuitry.

16. The system of claim 13, wherein the error corrector corrects the data by a double error correct triple error detect scheme.

17. The system of claim 13, wherein the error corrector corrects the data by a single error correct double error detect scheme.

18. The system of claim 13, wherein the operating voltage is adjusted by reducing the operating voltage of the memory array to a minimum operating voltage (VccMin) of the memory array.

19. The system of claim 13, wherein the memory array is a register file.

* * * * *